United States Patent
Wu et al.

(10) Patent No.: US 9,874,668 B2
(45) Date of Patent: Jan. 23, 2018

(54) QUANTUM ROD FILM

(71) Applicant: BenQ Materials Corporation, Taoyuan (TW)

(72) Inventors: Jian-Hung Wu, Taoyuan (TW); Shih-Wei Chao, Taoyuan (TW)

(73) Assignee: BenQ Materials Corporation, Taoyuan (TW)

(*) Notice: Subject to any disclaimer, the term of this patent is extended or adjusted under 35 U.S.C. 154(b) by 253 days.

(21) Appl. No.: 15/007,174

(22) Filed: Jan. 26, 2016

(65) Prior Publication Data

US 2016/0334556 A1    Nov. 17, 2016

(30) Foreign Application Priority Data

May 13, 2015    (TW) ............................. 104115271 A

(51) Int. Cl.
| H01L 33/00 | (2010.01) |
| G02B 5/20  | (2006.01) |
| G02B 5/18  | (2006.01) |
| H01L 33/60 | (2010.01) |
| G02F 1/1335 | (2006.01) |

(52) U.S. Cl.
CPC ............ *G02B 5/207* (2013.01); *G02B 5/1809* (2013.01); *G02B 5/1819* (2013.01); *G02F 1/13362* (2013.01); *H01L 33/60* (2013.01); *G02F 1/133609* (2013.01); *G02F 2001/133614* (2013.01); *G02F 2201/30* (2013.01); *G02F 2202/36* (2013.01)

(58) Field of Classification Search
CPC ............................. G02B 5/1809; H01L 33/60
USPC ............................. 257/98; 359/572; 362/19
See application file for complete search history.

(56) References Cited

U.S. PATENT DOCUMENTS

| 8,455,904 B2* | 6/2013 | Schardt ................ H01L 27/156 257/98 |
| 8,526,471 B2* | 9/2013 | Chang-Hasnain ... G02B 5/1809 359/572 |
| 9,427,933 B2* | 8/2016 | Cho ......................... B32B 3/30 |
| 2007/0153860 A1* | 7/2007 | Chang-Hasnain ... G02B 5/0816 372/50.124 |
| 2014/0362556 A1 | 12/2014 | Cho et al. |

FOREIGN PATENT DOCUMENTS

| CN | 1996067 A | 7/2007 |
| CN | 103201674 A | 7/2013 |
| KR | 20150033927 A | 4/2015 |
| TW | 201405193 A | 2/2014 |

* cited by examiner

Primary Examiner — Audrey Y Chang
(74) Attorney, Agent, or Firm — CKC & Partners Co., Ltd.

(57) ABSTRACT

A quantum rod film for a backlight unit of a liquid crystal display is disclosed herein. The quantum rod film includes a first barrier layer, a sub-wavelength microstructure on the first barrier layer, and a plurality of quantum rods, wherein the sub-wavelength microstructure includes gratings aligned in a parallel direction, an alignment microstructure disposed in grooves between the gratings in a direction perpendicular to the gratings, and a reflective layer on upper surfaces of the gratings. A plurality of quantum rods are arranged in the alignment microstructure of the sub-wavelength microstructure, and major axes of the quantum rods are aligned in a direction perpendicular to the gratings.

10 Claims, 4 Drawing Sheets

QUANTUM ROD FILM

RELATED APPLICATIONS

This application claims priority to Taiwanese Application Serial Number 104115271, filed May 13, 2015, which is herein incorporated by reference.

BACKGROUND

Field of Invention

This invention generally relates to a quantum rod film used in backlight unit of liquid crystal display for enhancing the gamut and light utilization of the liquid crystal display.

Description of Related Art

Polarizers commonly used in the liquid crystal display are absorptive polarizers. In the liquid crystal display, when the non-polarized light emitted from the backlight is incident onto the absorptive polarizers, a component of the incident light parallel to the absorption axis direction of the polarizers is absorbed and cannot pass through the absorptive polarizers. Therefore, after the light emitted from backlight passing through the absorptive polarizer, the light will lose at least 50%. In addition, after the light further passing through the electrode layer, color filter, liquid crystal module and glass substrate, only less than 10% of the light originally emitted from backlight can be transmitted to the observer. Accordingly, the light utilization of the backlight is quite low.

Several approaches to enhance the light utilization of the backlight have been proposed. For example, a brightness enhancement film (e.g., Dual Brightness Enhancement Film, DBEF) and/or a prism film may be used in backlight unit for continuously refracting and reflecting to recirculate and recycle the light which is unable to be transmitted by the polarizer. The light can be redirected out of the backlight unit to enhance the brightness of the backlight unit. In another example, concentrating the light of large viewing angle area of the liquid crystal display can increase the luminance at viewing direction. However, those solutions may increase the luminance of the backlight unit of a liquid crystal display; no significant effect is provided to the gamut and the color saturation of the liquid crystal display.

Therefore, a solution is proposed by using quantum dots in backlight source, to increase the gamut thereof. The quantum dot is a semiconductor material of zero-dimensional structure, and it is able to absorb UV light or blue light having shorter wavelength and emit green light or red light having longer wavelength to mix to emit white light source. Because the excitation spectrum of the quantum dots material is with a narrower full-width-at-half-maximum (FWHM), the gamut area of the liquid crystal display using the quantum dots will be more than 100% NTSC.

In addition, it is also proposed another approach that a quantum rod layer is integrated into the backlight unit. The quantum rod is a nano-scale semiconductor material. It is in a shape of a one-dimensional rod-like structure. The quantum rod film is different from the absorptive polarizer which absorbs non-polarizing light with evolution of heat. The quantum rod is able, to absorb the non-polarized light to emit a polarized light with a wavelength longer than the original non-polarized light from the major axis direction thereof. Because of the high internal quantum efficiency, most of the incident light from the backlight source is polarized. The quantum rods are aligned in a direction of major axis, and the emitted polarized light is efficiently passed through the transmission axis of the polarizer disposed on the liquid crystal display. Accordingly, compared to the backlight unit with quantum dots, the light utilization of a backlight unit with the quantum rods will further be enhanced.

Usually, the dichroic ratio (DR) is used to evaluate the efficiency of transformed polarizing light emitted by quantum rod film. The dichroic ratio is obtained by an equation $DR=Y_{//}/Y_{\perp}$, wherein the $Y_{//}$ is the transmittance obtained as the major axis of the quantum rod film is parallel to the transmission axis of the detection polarizer, and $Y_{\perp}$ is the transmittance obtained as the major axis of the quantum rod film is perpendicular to the transmission axis of the detection polarizer. When a light is not transmitted through a quantum rod film, the $Y_{//}$ and $Y_{\perp}$ are almost the same and thus the dichroic ratio is about 1. As the dichroic ratio is higher, the dichroism of the quantum rod film is significant. When a light is transmitted through a quantum rod film with a higher dichroism, the light will be transformed into a light with a better polarization and directionality. As using a quantum rod film in the stacked optical films of the current backlight unit, light will be reflected and refracted in and out of the optical films or be scattered by the particles composed in films such that dichroic ratio of the light excited by the quantum rod film passing through these optical films is going to be decreased. Thus, when the light generated from the backlight module with a quantum rod film passes through the polarizers of the liquid crystal display, the brightness of the display is not as expected.

Furthermore, as shown in FIG. 1 in the conventional quantum rod film 1 utilizing blue light backlight source ($L_B$) to emit red light ($L_R$) and green light ($L_G$), when the major axes of the quantum rods 2 are aligned in X-axis direction, the component of the blue light backlight source ($L_B$) in X-axis is absorbed by quantum rods 2 to emit red light ($L_R$) and green light ($L_G$) in the same X-axis direction, the component of the blue light backlight source ($L_B$) in Y-axis is most directly transmitted through the quantum rods 2 as transmitted blue light ($L_{B1}$). Since the polarization direction of the transmitted blue light ($L_{B1}$) is different from that of the emitted red light ($L_R$) and green light ($L_G$), part of the transmitted blue light ($L_{B1}$) may not pass through the transmission axis of the polarizer of the liquid crystal display, the light utilization of the transmitted blue light ($L_{B1}$) is lower. When the more transmitted blue light ($L_{B1}$) passes through the transmission axis of the conventional quantum rod film 1, the $Y_{\perp}$ component is more such that the dichroic ratio of the conventional quantum rod film 1 is lower. Furthermore, if most of the blue light backlight source ($L_B$) directly passes through the quantum rods 2, the red light ($L_R$) and green light ($L_G$) are emitted less, and the light intensity will be insufficient. Therefore, it requires increasing the amount of the quantum rods 2 to maintain the desired color coordinate of mixed white light. The cost of the quantum rod film will increase. There is a demand for a novel quantum rod film which decreases the transmitted blue light ($L_{B1}$) in Y-axis and increases the excitation number of the quantum rod 2 excited by the blue light backlight source ($L_B$) and the blue light utilization.

SUMMARY

According to one broad aspect of the invention, there provided a novel, inventive and useful quantum rod film.

The present invention is to provide a quantum rod film. In a preferred embodiment of the present invention, the quantum rod film includes a first barrier layer disposed at a side receiving light incident from a backlight source; a sub-wavelength microstructure disposed on the first barrier layer, wherein the sub-wavelength microstructure includes gratings aligned in a parallel direction, an alignment microstructure disposed in grooves between the gratings in a direction perpendicular to the gratings, and a reflective layer on upper surfaces of the gratings; a plurality of quantum rods arranged in the alignment microstructure of the sub-wavelength microstructure, wherein major axes of the quantum rods are aligned in a direction perpendicular to the gratings.

In one preferred embodiment of the quantum rod film of the present invention, each grating of the sub-wavelength microstructure has a width ranging from 70 nm to 75 nm, a depth ranging from 50 nm to 200 nm, and a pitch between each grating ranging from 70 nm to 75 nm.

In still one preferred embodiment of the quantum rod film of the present invention, the alignment microstructure has a width ranging from 5 nm to 20 nm, a depth ranging from 5 nm to 50 nm, and a pitch between each alignment microstructure ranging from 5 nm to 20 nm.

In another preferred embodiment of the quantum rod film of the present invention, the quantum rods have a length ranging from 10 nm to 50 nm, and an aspect ratio ranging from 5 to 10.

In further another preferred embodiment of the quantum rod film of the present invention, the quantum rods include quantum rods with same lengths or different lengths.

In further another preferred embodiment of the present invention, a material of the quantum rods is a semiconductor material selected from the group consisting of group III-V, group II-VI, group IV-VI compounds and a combination thereof.

In further another preferred embodiment of the quantum rod film of the present invention, a material of the first barrier layer is a material selected from the group consisted of polyethylene terephthalate, polymethyl methacrylate, cyclo-olefin polymer, polysiloxanes, fluororesin polymer, or metal oxide-containing organic/inorganic composite film.

In another preferred embodiment of the quantum rod film of the present invention, the reflective layer of the sub-wavelength microstructure is a metallic layer.

In another preferred embodiment of the present invention, the quantum rod film further includes a second barrier disposed on the sub-wavelength microstructure.

In another preferred embodiment of the quantum rod film of the present invention, a material of the second barrier is a material selected from the group consisted of polyethylene terephthalate, polymethyl methacrylate, cyclo-olefin polymer, polysiloxanes, fluororesin polymer, or metal oxide-containing organic/inorganic composite film.

DETAILED DESCRIPTION

The invention can be more fully understood by reading the following detailed description of the embodiment, with reference made to the accompanying drawings that illustrate the invention and it should be noted that the drawings are not to scale and only for illustration only.

The quantum rod film of the present invention will now be described in reference to the accompanying drawings. Similar numbers on the drawings refers to the same elements.

Figure 1:
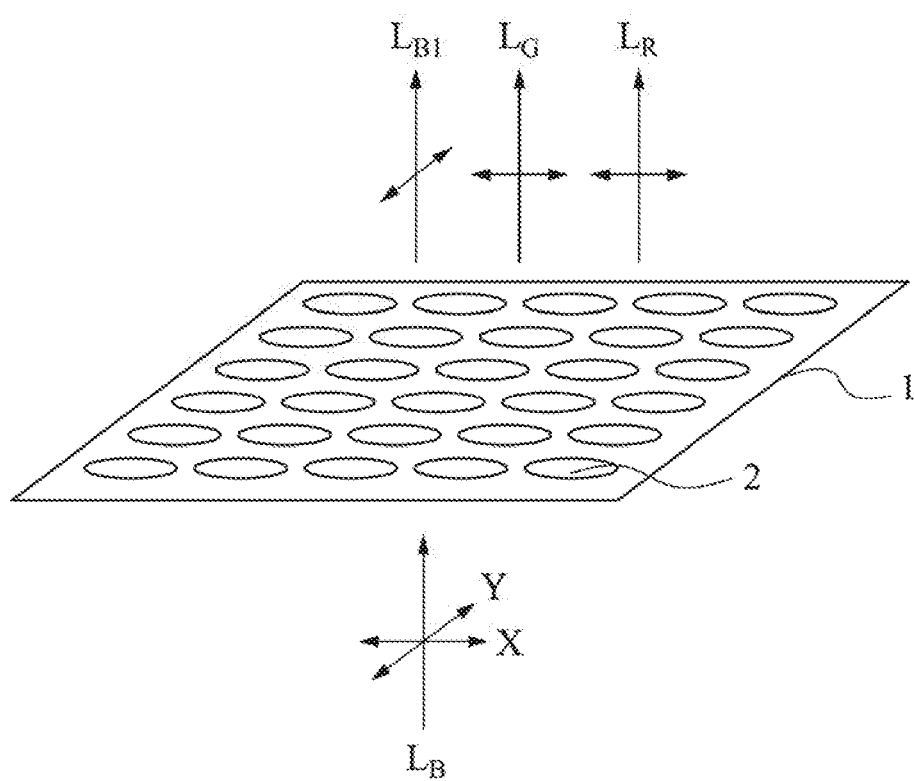
FIG. 1 is a perspective view of a quantum rod film in prior art.
Figure 2:
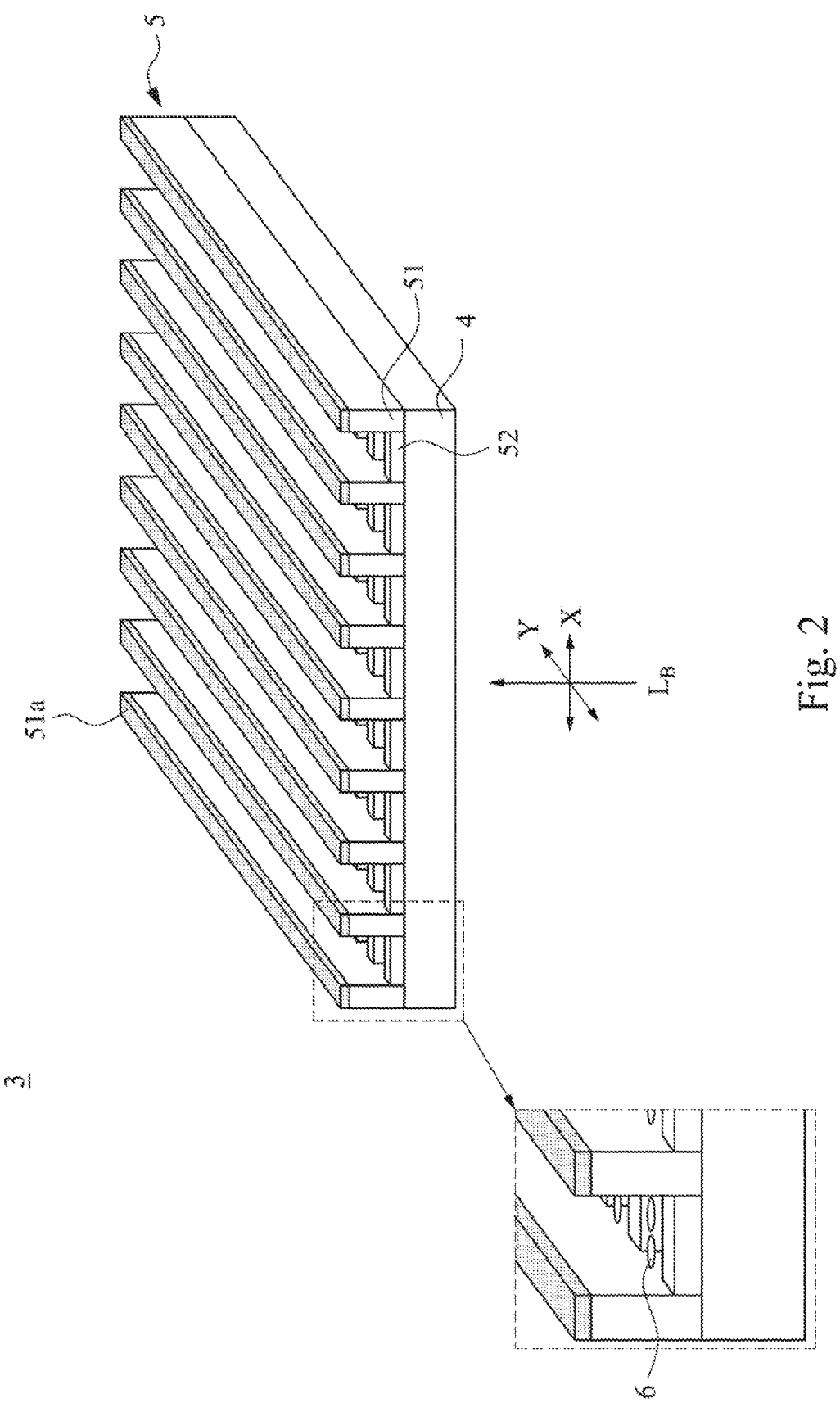
FIG. 2 is a perspective view of a quantum rod film of a preferred embodiment of the present invention.

Now referring to FIG. 2, it is a perspective view of a quantum rod film 3 of a preferred embodiment of the present invention. In a preferred embodiment of the present invention, the quantum rod film 3 includes a first barrier layer 4 disposed at a side receiving light incident from the backlight source ($L_B$); a sub-wavelength microstructure 5 disposed on the first barrier layer 4, wherein the sub-wavelength microstructure 5 including gratings 51 aligned in a parallel direction, an alignment microstructure 52 disposed in grooves between the gratings 51 in a direction perpendicular to the gratings 51, and a reflective layer 51a is on top surfaces of the gratings 51. A plurality of quantum rods 6 arranged in the alignment microstructure 52 of the sub-wavelength microstructure 5, wherein major axes of the quantum rods are aligned in a direction perpendicular to the gratings 51.

A sub-wavelength microstructure means it has a period of the microstructure smaller than the wavelength of light. When the wavelength of the light incident to the sub-wavelength microstructure is 3 times of the period of sub-wavelength microstructure, the light is reflected by the reflective layer of the sub-wavelength microstructure to be directionally polarized. When the wavelength of the light incident to the sub-wavelength microstructure is more than 3 times of the period of the sub-wavelength microstructure, the light is directly transmitted with less reflection. Therefore, reflection or transmission of the light can be determined by selectively controlling the period of the sub-wavelength microstructure. The sub-wavelength microstructure can be fabricated by nano-imprint, laser interference lithography, or electron beam direct-writing lithography.

Figure 3:
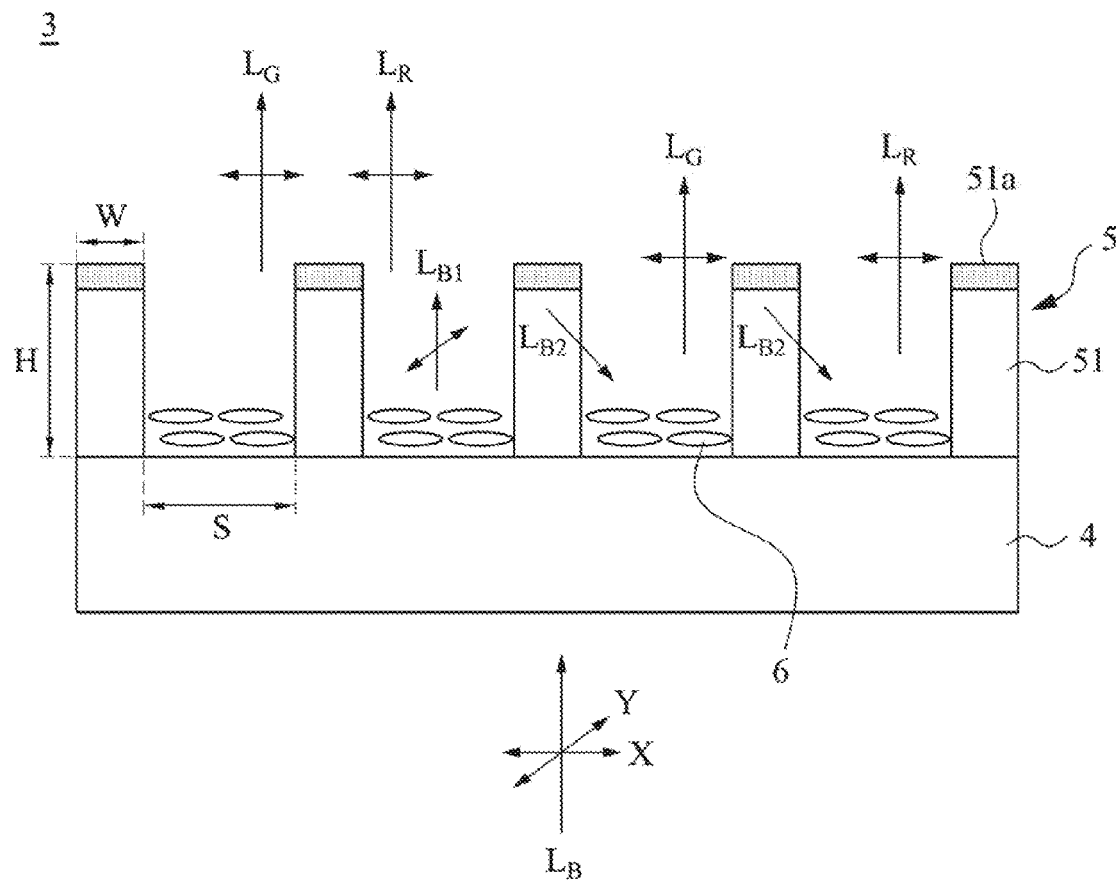
FIG. 3 is a perspective view showing the principle of the quantum rod film of a preferred embodiment of the present invention enhancing the utilization of the blue light backlight source.

FIG. 3 is a perspective view showing the principle of the quantum rod film of a preferred embodiment of the present invention enhancing the utilization of the blue light backlight source ($L_B$). When the blue light backlight source ($L_B$) passes through the quantum rod film 3, the quantum rods 6 in the alignment microstructure of the sub-wavelength microstructure 5 (not shown) are excited to emit red light ($L_R$) and green light ($L_G$) in X-axis direction to transmit through the gratings 51. Because of the presence of the sub-wavelength microstructure 5 and the reflective layer 51a, in a preferred embodiment of the present invention, each grating 51 of the sub-wavelength microstructure 5 has a width (W) ranging from 70 nm to 75 nm, a depth (H) ranging from 50 nm to 200 nm, and a pitch (S) between each grating ranging from 70 nm to 75 nm. The blue light backlight source ($L_B$) with wavelength of 420 nm to 500 nm is selectively reflected to be polarized, and the red light ($L_R$) and the green light ($L_G$) emitted by the quantum rods 6 are not reflected. Hence, the transmitted blue light ($L_{B1}$) directly passing through Y-axis of the quantum rods 6 is decreased, and the reflected blue light ($L_{B2}$) is reflected back to the quantum rods 6 to excite the quantum rods 6 to emit the red light ($L_R$) and the green light ($L_G$) in the same direction of X-axis again. Thus, the present quantum rod film 3 emits more red light ($L_R$) and green light ($L_G$) than the conventional quantum rod film. The portion of blue light backlight source ($L_B$) which is not absorbed by the quantum rods 6 and reflected by the sub-wavelength microstructure 5 will pass through and mix with the red light ($L_R$) and green light ($L_G$) as white light to be used as backlight unit for a liquid crystal display. Comparing with the conventional quantum rod film, backlight unit with the present quantum rod film 3 has better light utilization by enhancing excitation number of the blue light backlight source ($L_B$) exciting the quantum rods 6.

In the quantum rod film of a preferred embodiment of the present invention, each alignment microstructure has a width ranging from 5 nm to 20 nm, a depth ranging from 5 nm to 50 nm, and a pitch between each alignment microstructure ranging from 5 nm to 20 nm. The quantum rods have a length ranging from 10 nm to 50 nm and an aspect ratio ranging from 5 to 10. As the pitch of the alignment microstructure is less than the length of the quantum rods and wider than the diameter of the quantum rods, when the quantum rod-containing solution is coated on the alignment microstructure and then, cured and dried, the quantum rods are arranged in a direction of the major axes of the quantum rods in the alignment microstructure. In addition, the quantum rods can be further aligned by such as rubbing alignment and electro-field alignment to obtain a better alignment of the quantum rods.

In the quantum rod film of still a preferred embodiment of the present invention, the quantum rods include one or one more quantum rods with same lengths or different lengths. The intensity of the transmitted blue light, the emitted red light and the green light can be determined by adjusting the amount of then quantum rods with different lengths in order to mix and generate a white light to be used as a backlight source. The full width at half maximum for the emission spectrum of the quantum rod is narrow so that a wide gamut of a liquid crystal display can be obtained.

In an embodiment of the present invention, a material of the quantum rods is a semiconductor material selected from the group consisting of group III-V, group II-VI, group IV-VI compounds and a combination thereof. The semiconductor material can include but not limited to AlN, AlP, AlAs, AlSb, GaN, GaP, GaAs, GaSb, InN, InP, InSb, ZnO, ZnS, ZnSe, ZnTe, CdS, CdSe, CdTe, HgSe, HgTe, PbS, PbSe or PbTe.

In further another preferred embodiment of the quantum rod film of the present invention, a material of the first barrier layer is polyethylene terephthalate, polymethyl methacrylate, cyclo-olefin polymer, polysiloxanes, fluororesin polymer, or metal oxide-containing organic/inorganic composite film.

In another preferred embodiment of the quantum rod film of the present invention, the reflective layer of the sub-wavelength microstructure is a metallic layer. The reflective layer can be obtained by oblique angle sputtering to selectively deposit on the upper surface of the gratings of the sub-wavelength microstructure. The incident light to the sub-wavelength microstructure can be directed to a transmission light in X-axis and reflective light in Y-axis to be utilized again. Therefore, the light utilization and the dichroic ratio of the quantum rod film can be enhanced.

Figure 4:
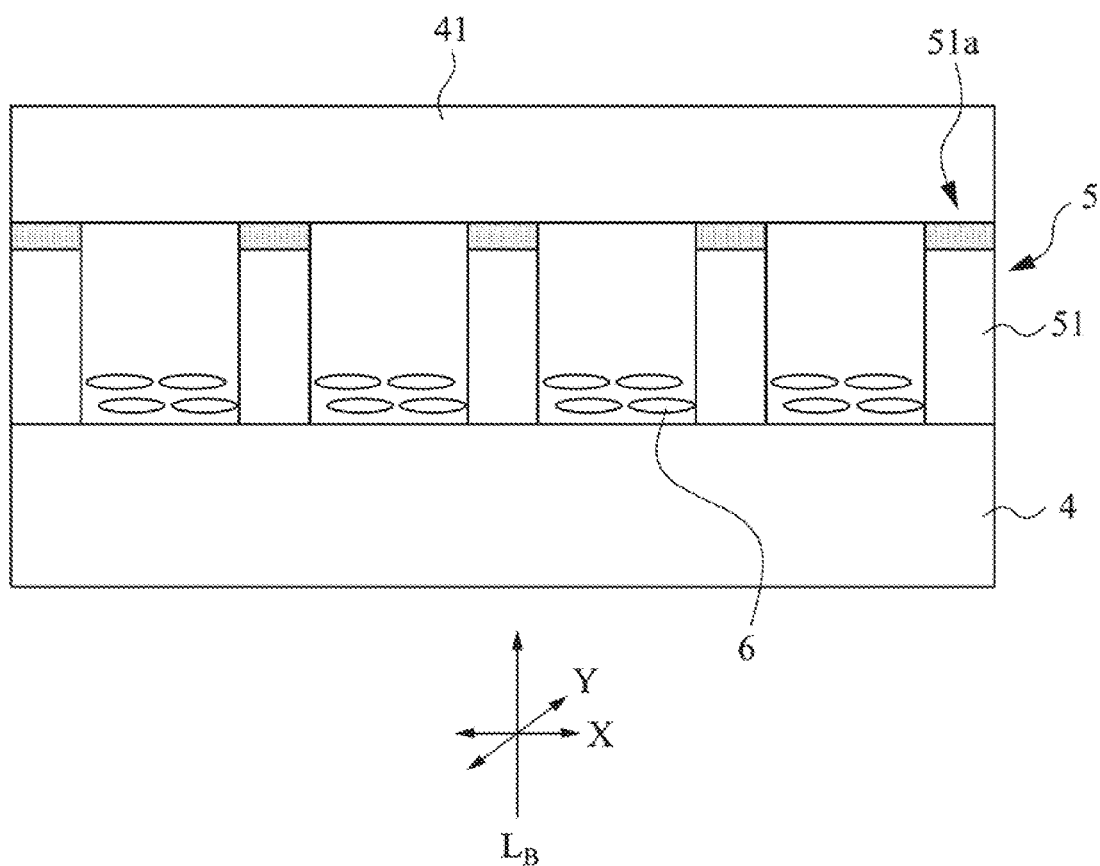
FIG. 4 is a perspective view of a quantum rod film of another preferred embodiment of the present invention.

Now referring to FIG. 4 showing another preferred embodiment of the present invention, the quantum rod film 31 further includes a second barrier 41 disposed on the sub-wavelength microstructure 5 for encapsulating the film to enhance the weathering resistance of the quantum rod film 31.

In another preferred embodiment of the quantum rod film of the present invention, a material of the second barrier is a material selected from the group consisted of polyethylene terephthalate, polymethyl methacrylate, cyclo-olefin polymer, polysiloxanes, flouroresin polymer or metal oxide-containing organic/inorganic composite film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A quantum rod film, comprising:
    a first barrier layer disposed at a side receiving light incident from a backlight source;
    a sub-wavelength microstructure disposed on the first barrier layer, wherein the sub-wave length microstructure comprises gratings aligned in a parallel direction, an alignment microstructure disposed in grooves between the gratings in a direction perpendicular to the gratings, and a reflective layer on upper surfaces of the gratings; and
    a plurality of quantum rods arranged in the alignment microstructure of the sub-wavelength microstructure, wherein major axes of the quantum rods are aligned in a direction perpendicular to the gratings.

2. The quantum rod film of claim 1, wherein each grating of the sub-wavelength microstructure has a width ranging from 70 nm to 75 nm, a depth ranging from 50 nm to 200 nm and a pitch between each grating ranging from 70 nm to 75 nm.

3. The quantum rod film of claim 1, wherein the alignment microstructure has a width ranging from 5 nm to 20 nm, a depth ranging from 5 nm to 50 nm, and a pitch between each alignment microstructure ranging from 5 nm to 20 nm.

4. The quantum rod film of claim 1, wherein the quantum rods have a length ranging from 10 nm to 50 nm, and an aspect ratio ranging from 5 to 10.

5. The quantum rod film of claim 1, wherein the quantum rods comprise quantum rods with same lengths or different lengths.

6. The quantum rod film of claim 1, wherein a material of the quantum rods is a semiconductor material selected from the group consisting of group III-V, group II-VI, group IV-VI compounds and a combination thereof.

7. The quantum rod film of claim 1, wherein a material of the first barrier layer is a material selected from the group consisted of polyethylene terephthalate, polymethyl methacrylate, cyclo-olefin polymer, polysiloxanes, fluororesin polymer, or metal oxide-containing organic/inorganic composite film.

8. The quantum rod film of claim 1, wherein the reflective layer of the sub-wavelength microstructure is a metallic layer.

9. The quantum rod film of claim 1, further comprising a second barrier disposed on the sub-wavelength microstructure.

10. The quantum rod film of claim 9, wherein a material of the second barrier is a material selected from the group consisted of polyethylene terephthalate, polymethyl methacrylate, cyclo-olefin polymer, polysiloxanes, fluororesin polymer, or metal oxide-containing organic/inorganic composite film.

* * * * *